United States Patent [19]

Iacovangelo

[11] Patent Number: 5,626,909

[45] Date of Patent: *May 6, 1997

[54] FABRICATION OF BRAZABLE IN AIR TOOL INSERTS

[75] Inventor: Charles D. Iacovangelo, Schenectady, N.Y.

[73] Assignee: General Electric Company, Schenectady, N.Y.

[*] Notice: The term of this patent shall not extend beyond the expiration date of Pat. No. 5,500,248.

[21] Appl. No.: 350,572

[22] Filed: Dec. 7, 1994

[51] Int. Cl.$^6$ .............................. C23C 16/00; B05D 3/02
[52] U.S. Cl. .................. 427/250; 427/255.7; 427/383.1; 427/399; 427/405; 51/309; 407/119
[58] Field of Search ............... 427/250, 383.1, 427/405, 255.7, 399; 51/309; 407/119

[56] References Cited

U.S. PATENT DOCUMENTS

| | | |
|---|---|---|
| 4,117,968 | 10/1978 | Naidich et al. . |
| 4,228,942 | 10/1980 | Dietrich . |
| 4,605,343 | 8/1986 | Hibbs, Jr. et al. . |
| 4,649,992 | 3/1987 | Green et al. . |
| 4,661,180 | 4/1987 | Frushour . |
| 4,767,050 | 8/1988 | Flood et al. . |
| 4,776,862 | 10/1988 | Wiand . |
| 4,784,023 | 11/1988 | Dennis . |
| 4,931,363 | 6/1990 | Slutz et al. . |
| 5,037,704 | 8/1991 | Nakai et al. . |
| 5,188,643 | 2/1993 | Iacovangelo ............... 51/293 |
| 5,500,248 | 3/1996 | Iacovangelo et al. ............ 427/250 |

FOREIGN PATENT DOCUMENTS

| | | |
|---|---|---|
| 0220964 | 5/1987 | European Pat. Off. . |
| 0402671 | 12/1990 | European Pat. Off. . |
| 2750436 | 5/1979 | Germany . |
| 60-155600 | 8/1985 | Japan . |
| 4201004 | 7/1992 | Japan . |
| 1162390 | 12/1966 | United Kingdom . |
| 2091763 | 8/1982 | United Kingdom . |

*Primary Examiner*—Roy V. King
*Attorney, Agent, or Firm*—William H. Pittman

[57] ABSTRACT

Tool inserts are produced that can be brazed in air at temperatures as low as 700° C. The tool compact, such as a polycrystalline diamond compact or a cubic boron nitride compact, has a multilayer coating comprising a metal bonding layer and a protective layer. Once coated with the bonding layer and the protective layer, the tool insert can be air brazed to a tool support in a manufacturing environment using a standard braze without a vacuum furnace or special atmosphere. A method for manufacturing the tool insert is also disclosed.

12 Claims, No Drawings

FABRICATION OF BRAZABLE IN AIR TOOL INSERTS

CROSS REFERENCE TO RELATED APPLICATIONS

The present application is related to U.S. Ser. No. 08/286,076, entitled "Fabrication of Brazable in Air Diamond Tool Inserts and Inserts Fabricated Thereby", now U.S. Pat. No. 5,500,248 and U.S. Ser. No. 08/310,449, entitled "Fabrication of Brazable in Air Diamond Tool Inserts and Inserts Fabricated Thereby", now U.S. Pat. No. 5,529,805.

BACKGROUND OF THE INVENTION

The present invention relates to brazable articles, and more particularly, to a brazable in air tool insert fabricated from a tool compact, such as a polycrystalline diamond compact or a cubic boron nitride compact, having a multilayer coating deposited thereon. The multilayer coating forms a bond in excess of 10 Kpsi to standard brazing compounds at temperatures as low as 700° C. in an air environment.

Compacts, such as polycrystalline diamond and cubic boron nitride, are often produced by a high temperature, high pressure process that uses cobalt as a sintering aid. The compacts are attached to a cemented tungsten carbide support before sintering. Cobalt can be added to the sintering furnace, however, more commonly, the cobalt is wicked out of the cemented tungsten carbide support. The cemented tungsten carbide support provides toughness to the polycrystalline diamond or cubic boron nitride compact, which are both hard but not tough.

This process has several disadvantages. The tungsten carbide support is bulky. It significantly reduces the space available for sintering the compacts, so that productivity is low. Not all types of tungsten carbide supports can be sintered with the compacts in the furnace. This prior art is limited to use of only specific types of tungsten carbide supports, while tool manufacturers prefer to have flexibility in their choice of tungsten carbide supports. With the tool compact attached to the tungsten carbide support during sintering and subsequent cooling, additional stresses are also created in the tool compact because the rate of thermal expansion of tungsten carbide is different from that of the tool compact material.

Brazing of inserts to tungsten carbide supports is typically performed at temperatures between 1000° and 1200° C. in a controlled vacuum with materials that contain transition metals to enhance the adhesion of the braze to the tool compact.

This high temperature braze process cannot be used with polycrystalline diamond compacts because the compacts are manufactured with cobalt or other ferrous metals as sintering aids. The metals act as catalysts for the decomposition of diamond to graphite when heated above approximately 700° C.

Cubic boron nitride compacts cannot be brazed at high temperatures either. At temperatures greater than 700° C., the trace components added to improve performance can migrate, degrading the material.

The high temperature process has other disadvantages: it is difficult to manage in production, uses expensive and often brittle brazes, and requires expensive equipment not usually found in the manufacturing environment in which the tools are used.

There is a great need in the industry, therefore, for a tool insert that can be brazed in air with standard low temperature brazes. To enable brazing in air, a coating material is needed that will bond to the tool compact and make a good metallurgical bond to the braze in an oxygen containing environment. Such tool inserts will then be sold to tool manufacturers for brazing onto their own tungsten carbide substrates. The resulting tools could find uses in industry in such applications as tool inserts, reamers, end mills, drill bits, dressers and cutting tools. The invention is not limited only to cutting tool inserts. The same coatings and method are suitable to any application in which a diamond or boron nitride surface is to be brazed to another hard surface, particularly when air brazing is desired.

There have been numerous attempts to solve the problem of achieving an adequate bond to the tungsten carbide support at temperatures that do not result in thermal degradation of the tool compact material. Generally, they fall into one of three categories: brazes, geometric effects, and coatings or intermediate layers.

U.S. Pat. No. 4,931,363 discloses the use of brazes containing chromium for improved bonding of thermally stable polycrystalline diamond compacts to tungsten carbide tools. EP 040,267 extends the use of high temperature carbide forming brazes to diamond created by chemical vapor deposition. Each of these methods requires high temperature brazes which must be bonded in controlled vacuum environments.

Changes in geometry are the basis of the teachings in U.S. Pat. Nos. 4,649,992 and 4,661,180 and 4,767,050 and 4,784,023. These patents utilize such shapes as frusto-conical shapes, interlocking alternating ridges, and pocketed substrates. These various approaches still require the use of expensive high temperature brazes processed in vacuum.

Prior inventions also utilize coatings and interlayers. U.S. Pat. No. 4,776,862 discloses the use of materials which form transition metal carbides as coatings on powders that are then brazed. The use of materials which form transition metal carbides as coatings on tool compacts before silver brazing is disclosed in U.S. Pat. No. 5,037,704, while GB 2091763A teaches the use of these materials as additives to abrasive powders during high pressure and temperature sintering. The Japanese patent, HEI-4[1992]-201,004, discloses the use of a thick transition metal layer 1–5 mm thick between the diamond and the tool before brazing in a vacuum at typically 1100° C.

SUMMARY OF THE INVENTION

In accordance with the present invention, there is provided a tool insert for brazing to a support, said tool insert comprising:
 a. a tool compact, and,
 b. a multilayer coating system comprising:
  i. a metal bonding layer deposited on and adhered to said tool compact, and,
  ii. a protective layer comprising a braze compatible material deposited on and adhered to said metal bonding layer.

According to another aspect of the present invention, there is provided a tool comprising a coated tool insert brazed to a support, said coated insert comprising:
 a. a tool compact, and,
 b. a multilayer coating system comprising:
  i. a metal bonding layer deposited on and adhered to said tool compact, and,
  ii. a protective layer comprising a braze compatible material deposited on and adhered to said metal bonding layer.

According to another aspect of the present invention, there is provided a method for manufacturing a tool insert comprising the steps of:

a. depositing a metal bonding layer on a tool compact, b. depositing a protective layer on the metal bonding layer to form a multilayer coated tool insert, c. heating the metal bonding layer at a temperature and for a time sufficient to form a metal carbide or nitride at the interface between the metal bonding layer and the tool compact to provide adhesion of the metal bonding layer to the tool compact, d. heating the protective layer to provide adhesion of the protective layer to the metal bonding layer, either simultaneously or sequentially with Step c.

DESCRIPTION OF THE PREFERRED EMBODIMENTS

The article of the present invention includes a tool compact, a metal bonding layer bonded to the tool compact, and a protective layer deposited over the metal bonding layer. The metal bonding layer enhances the adherence of the multilayer coating system to the tool compact through the formation of carbides or nitrides at the interface between the tool compact and the coating. The protective layer prevents oxidation of the metal bonding layer during brazing and provides a good bond to the braze material. The protective layer is necessary because transition metal compounds, particularly the carbides and oxides, do not bond well to low temperature brazes.

Tool compacts can be manufactured from materials such as polycrystalline diamond compacts (PCD) or cubic boron nitride compacts (CBN). For use in this invention, the tool compacts, such as PCD and CBN, can be sintered as free standing articles by processes known in the art. They will not be bonded to the cemented tungsten carbide support before sintering.

In accordance with the principles of the present invention, a metal bonding layer is deposited directly onto the tool compact. This deposition may be performed by known methods, e.g., by chemical vapor deposition or by a physical vapor deposition method, such as sputtering, or by plating. The metal bonding layer consists of such metals as chromium, or tungsten and/or titanium. A chromium coating thickness of 0.05–1.0 µm is preferred.

If tungsten and titanium are used, preferably they are deposited as an alloy, but it is contemplated that the deposition may include thin layers. The tungsten and titanium metal containing layer preferably consists entirely of tungsten and titanium metal. The tungsten and titanium of the alloy can be prealloyed, or the alloy can be formed during the deposition process.

The titanium component of the metal bonding layer alloy should be present in an amount sufficient to provide a good bond to the tool compact. The tungsten component of the alloy controls and reduces the activity of the titanium. Preferably the tungsten and titanium metal layer comprises from about 1 to about 50% by weight titanium with the balance being tungsten, more preferably from about 10 to about 30% by weight titanium with the balance being tungsten. A metal coat of a tungsten-titanium alloy is preferably 0.05–1.0 µm thick.

Next the metal coated tool compact is heated at a temperature and for a time sufficient to create metal carbides, if the tool compact is PCD, or metal nitrides, if the tool compact is CBN, at an interface between the tool compact and the metal layer. The heat treatment results in the formation of metal carbides or nitrides at the interface between the metal bonding layer and the tool compact. These carbides or nitrides improve the adhesion of the metal bonding layer to the tool compact. Desirably the degree of adhesion is greater than 20 Kpsi in shear, i.e., Instron shear test. The heating step may be performed either after deposition, as in the case of sputtered deposits, during deposition, as in the case of high temperature chemical vapor deposition processes, or at later stages of processing a completed tool.

The heating step is preferably carried out in an inert atmosphere or vacuum. An oxygen- and nitrogen-free atmosphere minimizes reactions that might result in the formation of undesirable oxides and nitrides on the exposed surface of the metal. A typical heat treating atmosphere is a hydrogen-argon mixture. A hydrogen/argon gas mixture of 4–100% hydrogen by volume, the balance argon, with or without titanium as an oxygen and nitrogen getter, has proven to be a satisfactory atmosphere for such heat treatment. The hydrogen in this atmosphere serves to prevent oxidation of the metal bonding layer. Titanium, which acts as a getter, or scavenger, of oxygen and nitrogen, can be introduced into the heat treat furnace as pellets, powder or through a titanium gas feed tube.

The amount of metal carbides or metal nitrides created must be sufficient to provide adhesion of the metal bonding layer to the tool compact. To generate the necessary carbides or nitrides, the heat treatment is performed at 600°–800° C. for about 5–60 minutes. Heat treating at about 675°–700° C. is preferred.

Although the metals of the bonding layer adhere well to the materials of the tool compact, the braze used to bond the tool insert to the tungsten carbide tool does not readily wet the metal bonding layer. As described herein, a protective overcoat on the metal bonding layer provides good adhesion to that bonding layer, protects the metal and the tool compact from oxidation, and affords compatibility with the braze.

An adherent protective layer is deposited by known methods, e.g., chemical or physical vapor deposition or plating directly onto the metal bonding layer to form a dual-coated tool insert. The protective layer desirably covers the entire underlying metal bonding layer to prevent deleterious chemical change, i.e., nitriding and oxidizing reactions, and loss of integrity due to exposure to the typical working environment. The protective layer is desirably compatible with the brazing material that is subsequently utilized to braze the resulting tool insert to a support. Preferred metals for the protective layer consist of silver, copper, gold, palladium, platinum, nickel and alloys thereof and include the alloys of nickel with chromium. The preferable thickness for this protective layer is 0.1–2.0 µm.

Achieving optimum adhesion between the protective layer and the underlying metal bonding layer also involves a heat treatment. Since the metal bonding layer tends to wet poorly with braze, the heat treatment should be carried out under conditions that reduce the migration of the metal of the bonding layer into the protective layer.

The same heat treatment used to bond the metal bonding layer to the tool compact may be used to bond the protective layer to the metal bonding layer. Thus, the two layers conveniently can be heat treated at the same time after the application of the two layers. As previously discussed, a hydrogen/argon gas mixture (4–100% hydrogen by volume, the balance argon) with or without titanium as an oxygen and nitrogen getter has proven to be a satisfactory atmosphere for such heat treatment. The hydrogen in this atmosphere serves to prevent oxidation of the chromium, silver and nickel.

Once coated with the metal bonding layer and the protective overcoat, this dual-coated article may be brazed in air to a support using a standard braze and without requiring a vacuum furnace or special atmosphere. Typical standard brazes are the silver brazes which have liquidus temperatures of 600°–900° C. An example of such a braze is Easy-Flo 45 (a product of Lucas Mulhaupt, Inc.), an alloy of, in percent by weight, 45% silver, 15% copper, 16% zinc and 24% cadmium with a liquidus temperature of 620° C. The brazing technique employed may be induction or other techniques known in the art. The brazing can be successfully performed at temperatures as low as 700° C.

The present invention results in fabrication of coated tool inserts suitable for brazing in air. Thus, a tool insert may be replaced on site, for example, in a typical industrial environment such as a machine shop, in an ambient shop atmosphere.

The following examples are presented to enable those skilled in the art to more clearly understand and practice the present invention. These examples should not be considered as a limitation upon the scope of the present invention, but merely as being illustrative and representative thereof.

EXAMPLE 1

Polycrystalline diamond compacts 6.35 mm in diameter and 0.5 mm thick were coated with the following coating systems: WTi (0.3 μm)/Ag (1.0 μm), Ti (0.2 μm)/W (0.5 μm)/Ag (1.0 μm), and Cr (0.3 μm)/NiCr (0.75 μm). Each of the three coating systems was deposited by sputtering. The three compacts were heat treated at 700° C. for 30–60 minutes in a 5% $H_2$/Ar gas using Ti powder to getter $O_2$. The coated compacts were each brazed to a WC support by heating an assembly of the coated sample, a brazing alloy preform and a cemented tungsten carbide substrate in air at about 700° C. for 0.5–5 minutes.

The three systems were then evaluated for adhesion by a Sebastian pull test. The adhesion of each of the three coatings exceeded the 10 Kpsi strength of the epoxy.

EXAMPLE 2

Thirteen cubic boron nitride compacts were also coated. The samples each measured 6.5 mm in diameter and 0.50 mm thick. All thirteen samples were coated with 0.3 μm of WTi and 1.0 μm Ag by sputtering. A second set of samples, identical to the first set, was coated with 0.3 μm of Cr and 0.75 μm Of NiCr.

Three different heat treatments were evaluated: 800° C. for 30 minutes, 860° C. for 30 minutes, and 700° C. for 60 minutes. Each of the 26 samples was subjected to one of the above heat treatments, then evaluated for brazability and adhesion of the coating system.

As in Example 1 above, a standard Sebastian pull test was one method used to measure adhesion. Each sample tested using this method exceeded 10 Kpsi.

An Instron shear test was also performed. Before testing, a coated cubic boron nitride compact sample was brazed to a WC support in an air environment in the same manner as Example 1. Twenty of the 25 samples tested with this method had shear strengths of 30–50 Kpsi. Many of the test samples had failures within the braze rather than between the coating and the cubic boron nitride compact. Adhesion strength of up to 49 Kpsi was achieved with both coating systems even at heat treat temperatures of 700° C.

What is claimed is:

1. A method for manufacturing a tool insert comprising the steps of:

a. depositing a metal bonding layer on a tool compact of cubic boron nitride, b. depositing a protective layer on the metal bonding layer to form a multilayer coated tool insert, c. heating the metal bonding layer at a temperature and for a time sufficient to form a metal carbide or nitride at the interface between the metal bonding layer and the tool compact to provide adhesion of the metal bonding layer to the tool compact, d. heating the protective layer to provide adhesion of the protective layer to the metal bonding layer, either simultaneously or sequentially with Step c.

2. A method in accordance with claim 1 wherein the heating is performed in a hydrogen/argon environment of 4–100% hydrogen by volume with the balance being argon.

3. A method in accordance with claim 1 wherein titanium is introduced into the heat treating as an oxygen and nitrogen getter.

4. A method in accordance with claim 1 wherein the heating is performed at temperatures of 600°–800° C. for 5–60 minutes.

5. A method in accordance with claim 1 wherein the heating is performed at temperatures of 675°–700° C. for 5–60 minutes.

6. A method in accordance with claim 1 wherein said protective layer is selected from the group consisting of silver, copper, gold, palladium, platinum, nickel and alloys thereof.

7. A method in accordance with claim 1 wherein said metal bonding layer comprises a tungsten-titanium alloy.

8. A method in accordance with claim 1 wherein said metal bonding layer comprises from about 1 to about 50 percent by weight titanium with the balance being tungsten.

9. A method in accordance with claim 8 wherein said protective layer comprises silver.

10. A method in accordance with claim 1 wherein said metal bonding layer comprises from about 10 to about 30 percent by weight titanium with the balance being tungsten.

11. A method in accordance with claim 1 wherein said metal bonding layer comprises chromium.

12. A method in accordance with claim 11 wherein said protective layer is selected from the group consisting of nickel and alloys of nickel and chromium.

\* \* \* \* \*